(12) United States Patent
Toyama

(10) Patent No.: US 9,272,675 B2
(45) Date of Patent: Mar. 1, 2016

(54) WIRING HARNESS

(75) Inventor: Eiichi Toyama, Kosai (JP)

(73) Assignee: Yazaki Corporation, Tokyo (JP)

( * ) Notice: Subject to any disclaimer, the term of this patent is extended or adjusted under 35 U.S.C. 154(b) by 191 days.

(21) Appl. No.: 13/577,438

(22) PCT Filed: Feb. 3, 2011

(86) PCT No.: PCT/JP2011/052250
§ 371 (c)(1),
(2), (4) Date: Sep. 14, 2012

(87) PCT Pub. No.: WO2011/096478
PCT Pub. Date: Aug. 11, 2011

(65) Prior Publication Data
US 2013/0032393 A1 Feb. 7, 2013

(30) Foreign Application Priority Data
Feb. 5, 2010 (JP) ................................. 2010-023724

(51) Int. Cl.
*H01R 4/18* (2006.01)
*B60R 16/02* (2006.01)
(Continued)

(52) U.S. Cl.
CPC .......... *B60R 16/0215* (2013.01); *H05K 9/0018* (2013.01); *H05K 9/0098* (2013.01); *H01R 4/18* (2013.01); *H01R 4/28* (2013.01); *H01R 9/032* (2013.01)

(58) Field of Classification Search
CPC ....................................................... H01B 7/29
USPC ................................................... 439/607.47
See application file for complete search history.

(56) References Cited

U.S. PATENT DOCUMENTS 4,662,700 A * 5/1987 Markham ................. 439/607.52
5,083,929 A * 1/1992 Dalton ................. H01R 9/0524
174/359

(Continued)

FOREIGN PATENT DOCUMENTS

CN 101620895 A 1/2010
JP 6-41028 5/1994

(Continued)

OTHER PUBLICATIONS

International Search Report from PCT/JP2011/052250 dated Apr. 26, 2011.

(Continued)

*Primary Examiner* — Timothy Thompson
*Assistant Examiner* — Krystal Robinson
(74) *Attorney, Agent, or Firm* — Locke Lord LLP

(57) ABSTRACT

The invention relates to a wiring harness having a plurality of electrical wires and a tubular shielding member capable of accommodating the plurality of electrical wires as a whole therein. The wiring harness includes a plurality of electrical wires; and a tubular shielding member configured to receive the plurality of electrical wires as a whole, and coupled to a shield part of a device side via a tubular terminal portion thereof. The tubular shielding member includes a shielding body portion disposed over a bundled portion in which the plurality of electrical wires is bundled as a whole, and a shielding terminal portion disposed over an enlarged portion which gradually enlarges from the bundled portion in conformity with terminal arrangement of the plurality of electrical wires or a shape of the shield part of the device side, and continuous with at least one end of the shielding body portion. The shielding body portion is formed of metallic film and the shielding terminal portion is formed of braid.

11 Claims, 2 Drawing Sheets

(51) Int. Cl.
*H05K 9/00* (2006.01)
*H01R 4/28* (2006.01)
*H01R 9/03* (2006.01)

(56) References Cited

U.S. PATENT DOCUMENTS

| | | | | |
|---|---|---|---|---|
| 5,866,843 | A | * | 2/1999 | Ikeda ............... B60R 16/0215 174/36 |
| 6,837,728 | B2 | | 1/2005 | Miyazaki et al. |
| 2002/0170729 | A1 | * | 11/2002 | Murakami ......... B60R 16/0215 174/386 |
| 2004/0144557 | A1 | * | 7/2004 | Miyazaki .................... 174/72 A |
| 2005/0162015 | A1 | * | 7/2005 | Yamaguchi et al. ......... 307/10.1 |

FOREIGN PATENT DOCUMENTS

| JP | 2001-332139 | | 11/2001 |
|---|---|---|---|
| JP | 2003-115223 | | 4/2003 |
| JP | 2003-197037 | | 7/2003 |
| JP | 2003-198178 | A | 7/2003 |
| JP | 2004-171952 | A | 6/2004 |
| JP | 2004171952 | A * | 6/2004 |
| JP | 2004-214062 | | 7/2004 |
| JP | 2005-149963 | | 6/2005 |
| JP | 2005-222832 | | 8/2005 |
| JP | 2006-164701 | | 6/2006 |
| JP | 2006-269666 | | 10/2006 |
| JP | 2007-213868 | | 8/2007 |
| JP | 2010-015816 | | 1/2010 |

OTHER PUBLICATIONS

Supplementary European Search Report dated Mar. 7, 2014, issued for the European patent application No. 11739826.3.

Chinese Office Action dated Mar. 12, 2014 issued for corresponding Chinese Patent Application No. 201180013536.1.

\* cited by examiner

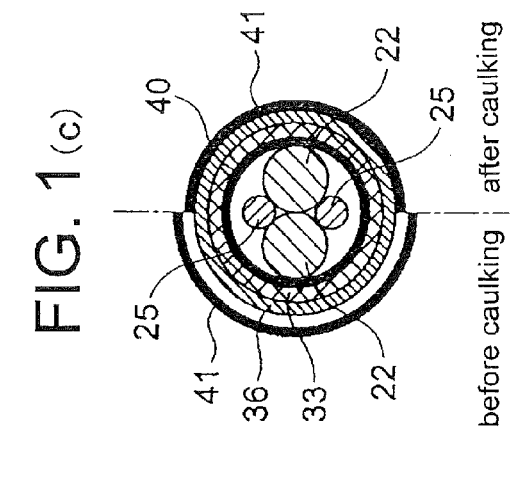
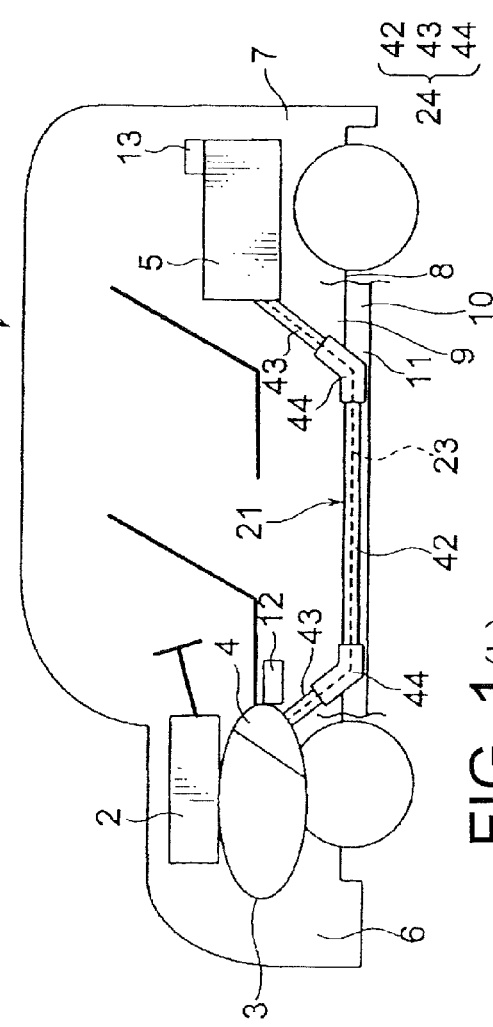
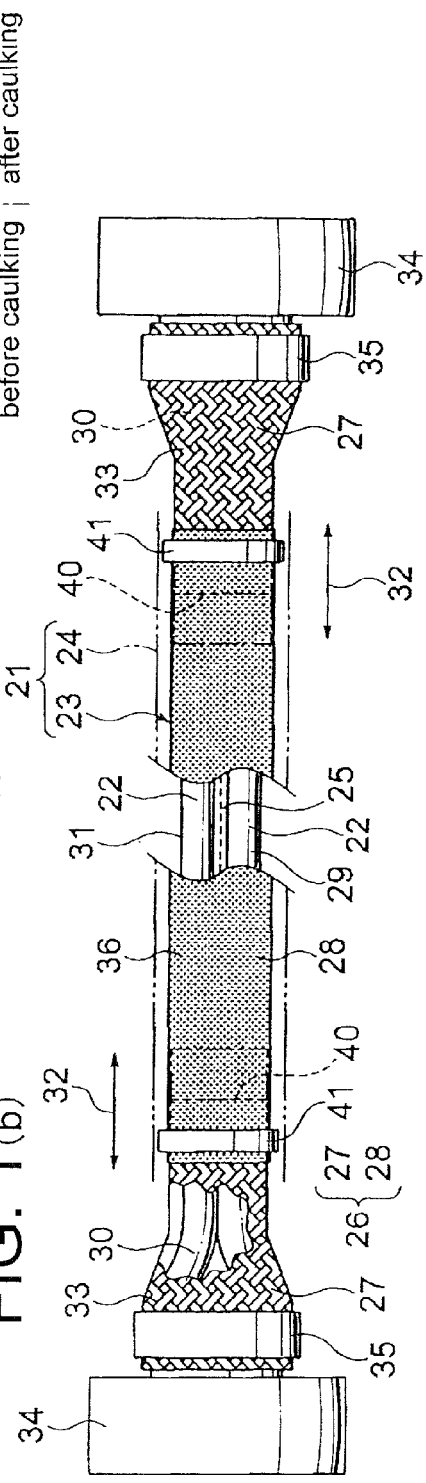

WIRING HARNESS

TECHNICAL FIELD

The invention relates to a wiring harness having a plurality of electrical wires and a tubular shielding member capable of accommodating the plurality of electrical wires as a whole therein.

BACKGROUND ART

JP 2003-197037 (A) discloses a plurality of electrical wires and a tubular shielding member capable of accommodating the plurality of electrical wires as a whole therein. The tubular shielding member is asserted to be a tubular braided member formed by weaving or knitting a fine element wire having electrical conductivity. The above tubular shielding member is employed for imparting electromagnetic shielding properties to the plurality of electrical wires.

JP 2007-213868 (A) also discloses imparting electromagnetic shield properties to a flexible printed cable having a plurality of circuits. Specifically, aluminum film is wound around the flexible printed cable.

CITATION LIST

Patent Literature

[PTL 1]
JP 2003-197037 (A)
[PLT 2]
JP 2007-213868 (A)

SUMMARY OF INVENTION

Technical Problem

The conventional tubular braided member (i.e., tubular shielding member) as disclosed in JP 2003-197037 (A) is made such that its width is substantially constant over its entire length. This means that electrical wires are arranged at even intervals. Accordingly, this type of wiring harness generally needs relatively huge space for arranging the electrical wires therein.

In order to solve the above problem, the electrical wires are tied together to make a bundle, and arranged in conformity with the associated terminal at their end portions. In other words, the bundle of electrical wires is enlarged or extended at the end of electrical wire. In this case, the wiring harness can be downsized. If the tubular shielding member is a tubular braided member formed by weaving or knitting a fine element wire, stretch properties of the tubular braided member can be sufficiently utilized.

However, the tubular braided member cannot bear relatively heavy member which is comprised of about 300 element wires or above and is currently used with a vehicle.

In this regard, it has been proposed that the tubular braided member is substituted with the tubular metallic film member as described in JP 2007-213868 (A). However, the tubular metallic film member has the following drawbacks.

Because the metallic film does not stretch properties, it is difficult and cost-consuming process to manufacture a tubular member having a diameter which varies partly. Furthermore, the tubular metallic film shielding member hardly satisfies tensile strength needed for connection with the shield part of device side. As a result, electrical connection reliability or electrical contact reliability may be reduced. In addition, it is probable that terminal connection is not smoothly performed at the terminal of the electrical wire. This is because the tubular metallic film does not have the stretch properties as the tubular braided member has.

In view of the above, the invention is intended to provide a novel wiring harness which is downsized, is weight-saved, and has an enhanced workability while maintaining enough connection reliability. In addition, the wiring harness in accordance with the invention has enhanced electromagnetic shielding effect.

Solution to Problem

In order to solve the afore-mentioned problems and drawbacks, in one aspect, the invention provides a wiring harness, which includes a plurality of electrical wires; and a tubular shielding member configured to receive the plurality of electrical wires as a whole therein, and coupled to a shield part of a device side via a tubular terminal portion. The tubular shielding member includes a shielding body portion disposed over a bundled portion in which the plurality of electrical wires is bundled as a whole, and a shielding terminal portion disposed over an enlarged portion which gradually enlarges from the bundled portion in conformity with terminal arrangement of the plurality of electrical wires or a shape of the shield part of the device side, and continuous with at least one end of the shielding body portion. The shielding body portion is formed of metallic film and the shielding terminal portion is formed of braid.

Preferably, the tubular shielding member may have an overlapped section in which the braid overlaps with the metallic film, and the braid and the metallic film are coupled to each other in the overlapped section.

Preferably, the braid and the metallic film are coupled to each other in the overlapped section in accordance with clamping or clipping process by using at least two ring members. Preferably, one ring member of the at least two ring members may be disposed on an inner side of the tubular shielding member, and an another ring member of the at least two ring member may be disposed on an outer side of the tubular shielding member.

Preferably, the braid and the metallic film may be coupled to each other in the overlapped section by winding a bundling member around the tubular shielding member, or by taping.

Preferably, the shielding body portion may be solely formed of the metallic film or is formed of multiple layers, of which one is the metallic film.

Preferably, the wiring harness may further include a shield shell which is integrally formed with the shielding terminal portion in which the tubular terminal portion is disposed.

In accordance with the afore-mentioned invention, the tubular terminal portion is formed of braid, and the remaining portion (i.e., the majority of the tubular shielding member) is formed of metallic film The braid has stretch properties. Accordingly, the braid is superior to the metallic film in the connection to the shield part of the device side. On the other hand, the metallic film is lighter than the braid, and is superior to the braid in electromagnetic shielding properties. The plurality of electrical wires includes the bundled portion and the enlarged portion which is continuous with the bundled portion. The bundled portion accounts for the majority of the electrical wires. Due to this configuration, the plurality of electrical wires can be arranged such that its width or breadth is minimized The bundled portion may be formed by arranging the plurality of electrical wires at the same interval. In other words, the width of the bundled portion is made less than that of the enlarged portion. On the other words, in the enlarged portion of the plurality of the electrical wires, the interval between the terminals is enlarged in conformity with terminal arrangement or a shape of the shield part of the device side.

In the tubular shielding member, the shielding terminal portion is fixed and coupled to at least one end of the shielding body portion. In other words, the shielding terminal portion can be fixed and coupled to the shielding body portion in the overlapped section. In other words, the afore-mentioned at least one end of the shielding body portion corresponds to the overlapped section. The overlapped section can be formed by overlapping the braid and the metallic film. In this case, untrimmed or unprocessed edged braid may be directly employed without any further treatment or process. The connection or coupling between the braid and the metallic film will be multiple contact points connection or coupling due to net or mesh structure of the braid which has a convex portion and a concave portion.

The wiring harness has the shielding body portion which accounts for the majority of the tubular shielding member, and is formed of metallic film. Accordingly, the shielding body portion is flexible. In addition, the wiring harness has the shielding terminal portion which is formed of braid, and is thus flexible. Such a flexible wiring harness will not adversely affect its workability, when it is manufactured, transported, or mounted to a vehicle.

The terminal connection may be operated in the terminal of the electrical wire after tucking the shielding terminal portion formed of braid so as to expose the terminal on the outside of the shielding terminal portion. The shielding body portion may be integrally formed with the shield shell in advance. If the shielding body portion is solely formed of metallic film, double layers of the metallic film are desired in light of strength or intensity thereof. Furthermore, if the shielding body portion includes a plurality of layers, one of which is metallic film layer, it will have enhanced strength or intensity. In this case, it is preferable to apply a layer of resin (i.e., a resin sheet) to the metallic film layer, and to bond the layer of resin to the metallic film layer.

Advantageous Effects of Invention

In accordance with the invention defined by claim 1 of the invention, there is provided a novel wiring harness which is downsized, is weight-saved, and has an enhanced workability while maintaining enough connection reliability. In addition, the above wiring harness has enhanced electromagnetic shielding effect.

Due to the inventions defined by claims 2-4 of the invention, connection reliability (i.e., contact reliability) can be further enhanced.

Due to the invention defined by claim 5 of the invention, the mechanical intensity or strength of the shielding body portion can be further enhanced or improved.

The invention defined by claim 6 of the invention would make it easy to assemble the wiring harness, as well as, to improve connection workability in relation to the device(s).

BRIEF DESCRIPTION OF DRAWINGS

FIG. 1(*a*) is a schematic view of a vehicle in which one embodiment of a wiring harness in accordance with the invention is arranged; FIG. 1(*b*) illustrates the specific structure of one embodiment of a wiring harness in accordance with the invention; and FIG. 1(*c*) is a cross-sectional view depicting an overlapped section before and after caulking.

DESCRIPTION OF EMBODIMENTS

Figure 2A:
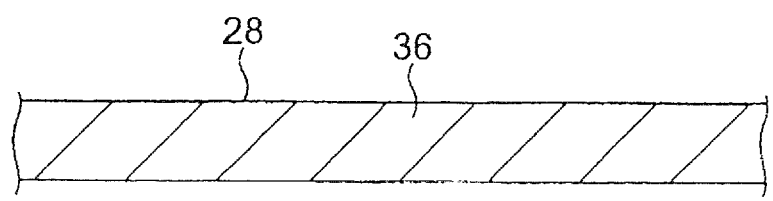
FIGS. 2(*a*) and 2(*b*) are cross-sectional views of the specific structure of a shielding body portion in accordance with the invention.

A wiring harness has a plurality of electrical wires, and a tubular shielding member configured to accommodate the plurality of electrical wires as a whole therein. The tubular shielding member has at least one end formed of braid, and the majority of the remaining portion (i.e., the portion other than the at least one braided end) formed of metallic film. The plurality of electrical wires includes a bundled portion and an enlarged or extended portion which is continuous with one end of the bundled portion. The bundled portion, which is a majority of the plurality of electrical wires, is arranged such that its width can be minimized. The wiring harness remains flexible as a whole even if the plurality of electrical wires is received or accommodated in the tubular shielding member. The tubular shielding member may be formed by winding shielding material around the plurality of electrical wires.

One embodiment of a wiring harness in accordance with the invention will be hereinafter described in detail with reference to FIG. 1. For reference, FIG. 1(*a*) is a schematic view of a vehicle in which one embodiment of a wiring harness in accordance with the invention is arranged; FIG. 1(*b*) illustrates the specific structure of one embodiment of a wiring harness in accordance with the invention; and FIG. 1(*c*) is a cross-sectional view depicting an overlapped section before and after caulking.

A wiring harness as mentioned in this embodiment is intended to, but not limited to, use in a hybrid or electric vehicle. Specifically, a hybrid vehicle will be exemplified. However, in the case of an electric vehicle, the same wiring harness as described hereinafter may be employed.

Referring to FIG. 1, a reference numeral 1 represents a hybrid vehicle. The hybrid vehicle 1 may use two power sources such as an engine 2 and a motor 3. Electrical power is supplied from a battery 5 via an inverter 4 to the motor 3. In this embodiment, the engine 2, the motor 3, and the inverter 4 may be disposed at a front side 6 of the vehicle in the interior of the vehicle. For reference, the front side 6 corresponds to a location in which a front wheel(s) is disposed. Moreover, the battery 5 is disposed at a back side 7 of the vehicle in the interior of the vehicle. For reference, the back side 7 corresponds to a location in which a back wheel(s) is disposed.

A reference numeral 8 represents a vehicle body frame or a frame. Referring to FIG. 1, there are provided an upper portion 9 which is above the vehicle body frame 8 and a lower portion 10 which is under the vehicle body frame 8. In the lower portion 10 of the vehicle body frame 8, there is provided an approximately convex reinforcement 11 for the purpose of enhancing the intensity or strength of the vehicle. The reinforcement 11 extends in an anteroposterior direction. A reference numeral 12 represents an electric junction box such as a known relay box which is disposed at the front side 6 in the interior of the vehicle. In addition, a reference numeral 13 represents a known low-voltage battery which is disposed at the back side 7 of the vehicle in the interior of the vehicle. The low-voltage battery 13 may be disposed otherwise.

In the embodiment, the motor 3 may include a motor and a generator. Also, the inverter 4 may include a inverter and a converter. The inverter 4 may be an inverter assembly in which also includes an air-conditioner inverter, a generator inverter, a motor inverter or the like. The battery 5 can be formed of Ni-MH-based material or Li-ion-based material, and can be formed as a module. In addition, an electrical storage device such as a capacitor may be employed. The battery 5 may include any type of batteries which can be employed in hybrid or electric vehicles.

The inverter 4 (i.e., a first device) and the battery 5 (i.e., a second device) are connected to each other via a wiring harness 21 of the invention.

The wiring harness 21 may include a electromagnetically-shielded wiring harness 23 having a relatively large high-voltage electrical wire 22 (i.e., an electrical wire) configured to electrically connect the inverter 4 and the battery 5, and an electrical wire-protecting member 24 for inserting a portion to be sought for protection of the wiring harness 23 (i.e., a portion to be sought for protection of the high-voltage electrical wire 22) thereinto and protecting it. In the embodiment, the wiring harness 21 includes the electrical wire-protecting portion 24. However, the wiring harness 21 may be comprised of the wiring harness 23 without the electrical wire-protecting portion 24.

The wiring harness 21 may include, but is not limited to, a plurality of known low-voltage electrical wires 25. Because the low-battery 13 is disposed at the back side 7 in the interior of the vehicle, the embodiment of the wiring harness has a low-voltage electrical wire 25. In the embodiment, modularization is intended.

In accordance with the embodiment, the wiring harness 21 extends from the front side 6 of the vehicle via the lower portion 10 of the vehicle body frame 8 to the back side 7 of the vehicle in the interior of the vehicle. The wiring harness 21 can be formed such that it passes through the vehicle body frame 8. The above structure of the wiring harness 21 will be hereinafter described in detail.

The electromagnetically-shielded wiring harness 23 includes a plurality of high-voltage electrical wires 22, a plurality of low-voltage electrical wires 25, a tubular shielding member 26 configured to receive the plurality of high voltage electrical wires 22 and the plurality of low-voltage electrical wires 25 as a whole therein. Moreover, the electromagnetically-shielded wiring harness 23 can be constituted such that electromagnetic shielding effect can be provided by the tubular shielding member 26. The tubular shielding member 26 can include shielding terminal portions 27 and a shielding body portion 28 communicating with the shielding terminal portions 27.

In accordance with the embodiment, the plurality of high-voltage electrical wires 22 may include two high-voltage electrical wires. However, the number of the electrical wires may vary in dependence on the specific needs. The high-voltage electrical wire 22 is relatively thick or large, non-shielded electrical wire, and has an electrically-conductive conductor portion (i.e., a central conductor portion) 29 at its center or middle portion. The conductor portion (not shown) may be formed of copper, copper alloy, or aluminum. The high-voltage electrical wire 22 also has a covering portion 29 disposed over the central conductor portion. In the terminal end of the high-voltage electrical wire 22, the conductor portion is provided with a terminal (not shown) for connection to the inverter 4 and the battery 5. Furthermore, the conductor portion may include, but is not limited to, a conductor formed by stranded element wires, or a rod-shaped conductor having rectangular or annular cross-section.

The high-voltage electrical wire 22 may include a enlarged or extended portion 30 in which the width or interval between the electrical wires is enlarged or broadened in conformity with the arrangement of the terminal, and a bundled portion 31 in which the electrical wires are bundled together. The bundled portion 31 accounts for the majority of the high-voltage electrical wire 22 over the entire length of the high-voltage electrical wire 22.

The bundled portion 31 can be covered with the shielding body portion 28 of the tubular shielding member 26. Moreover, the enlarged or extended portions 30 which are located at both ends of the bundled portion 31 are covered with the shielding terminal portions 27 respectively. The boundary between the bundled portion 31 and the enlarged or extended portion 30 is covered with an overlapped section 32 which is formed by overlapping metallic film 36 of the shielding body portion 28 and braid 33 of the shielding terminal portion 27. The metallic film 36 and the braid 33 will be hereinafter described in detail. More specifically, the boundary is covered with both the shielding body portion 28 and the shielding terminal portion 27.

The shielding terminal portions 27 can be formed corresponding to the bundled portion 30 as stated previously. The shielding terminal portion 27 can be formed in the shape of tube such that it can sufficiently deal with or accommodate the extended or enlarged terminals of the high-voltage electrical wires 22. Specifically, the shielding terminal portion 27 may be formed of braid 33. The shielding terminal portion 27 has electromagnetic shielding properties for the purpose of guard against electromagnetic field or wave. The shielding terminal portion 27 can be formed of the braid 33 having a number of fine, electrically-conductive element wires. However, the shielding terminal portion 27 has a length short enough to correspond to the enlarged or extended portion 30. Accordingly, the increase of the weight of the tubular shielding member 26 due to the use of such a shielding terminal portion 27 will be minimal. The shielding terminal portion 27 is formed of braid 33, thereby allowing for stretch properties.

In accordance with the embodiment, the shielding terminal portion 27 is formed by cutting a known tubular braid member short. The cut edge of the tubular braid member is not subjected to further process, and remains untrimmed Accordingly, it is advantageous not to have any further treatment or process.

One end of the shielding terminal portion 27 is formed as tubular terminal portion of the tubular shielding member 26, and the opposite end of the shielding terminal portion 27 at least partly constitutes the overlapped section 32. In the one end of the shielding terminal portion 27, there is provided a shield shell 34 which is electrically connected to a shield part of the device (not shown) such as the inverter 4, the battery, or the like by fixing the shield shell 34 to the shield portion of the device. The shield shell 34 may be an electrically-conductive metallic member, and may be fixed or connected to the shielding terminal portion 27 by means of caulking. The caulking can be carried out by using a caulking ring 35. The caulking may be carried out in accordance with a known caulking process or method.

The shielding body portion 28 is formed corresponding to the bundled portion 31, as stated previously. Accordingly, the shielding body portion 28 does not need stretch properties as needed by the shielding terminal portion 27, and is formed such that its width is made relatively constant over its entire length. The shielding body portion 28 is a tubular metallic film member in which the electrically-conductive metallic film is formed in the shape of tube. This shielding body portion 28 is provided for guarding against generating electromagnetic field or wave. The metallic film material, which can be employed for the shielding body portion 28, preferably include a copper film. However, the metallic film material is not limited to the copper film. In accordance with the embodiment, the shielding body portion 28 can be formed of one layer of the metallic film 36, as shown in FIG. 2(a). In order to further enhance the strength or intensity of the shielding body portion 28, the shielding body 28 may be formed of at least two layers of the metallic layers.

Figure 2B:
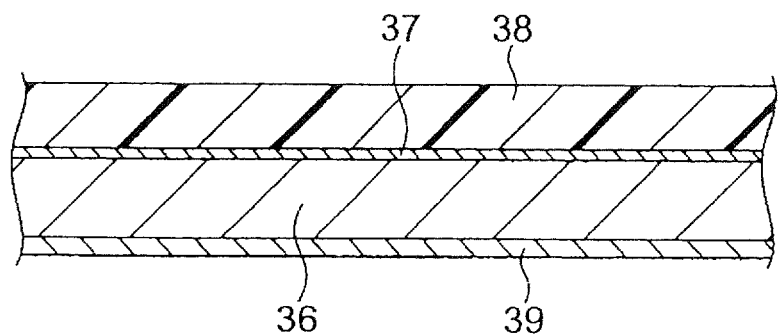

Referring to FIG. 2(b), the shielding body portion 28 can be formed of a plurality of layers, which includes a layer of the metallic film. In this case, the strength or intensity of the shielding body 28 can be further enhanced. Preferably, a layer of resin (i.e., a resin sheet) 38 can be disposed over the metallic layer such as the copper layer via an adhesive layer 37. Resin which can be employed for the layer of resin 38 may include, but is not limited to, PET (i.e., PET sheet). A reference numeral 39 represents a tin-plated layer. The tin-plated layer 39 may or may not be present.

The overlapped section 32 is a portion or section formed by overlapping the metallic film 36 and the braid 33. In accordance with the embodiment, the overlapped section 33 is disposed such that the metallic film 36 is externally arranged. In other words, the braid is disposed inside the metallic film 36. The metallic film 36 and the braid 33 are clamped or clipped by two ring members such that they are electrically connected to each other and mechanically secured to each other. The two ring members correspond to a tang 40 and a caulking ring 41 which are respectively disposed inside and outside of the tubular shielding member 26 at the overlapped section 32. The two ring members can clamp or clip the metallic film 36 and the braid 33 by caulking them against the caulking ring 41.

Once the metallic film 36 and the braid 33 is clamped or clipped between the tang 40 and the caulking ring 41, electrical connection will occur. The electrical connection can be multiple contact points connection due to net or mesh structure of the braid 33 which has a convex portion and a concave portion. It may be advantageous to employ multiple contact points connection for the purpose of improving or enhancing contact reliability. Moreover, it may be advantageous to carry out caulking in light of contact reliability. In accordance with the embodiment, the tang 40 and the caulking ring 41 is formed of metallic material. However, the tang 40 may be formed of resin which has enough intensity or strength.

In accordance with the above embodiment, the metallic film 36 and the braid 33 is electrically connected and fixed to each other by clamping or clipping method by the use of the two ring members. Alternatively, any banding member (e.g. a banding band) can be wound around the tubular shielding member 26 (i.e., the overlapped section 32) such that it can bundle the bundled portion 31. Alternatively, a tape may be wound around the tubular shielding member 26.

Because the shielding body portion 28 can be fixed and connected as such, the untrimmed or unprocessed terminal or terminal end can be directly used in the embodiment of the invention.

The electrical wire-protecting member 24 is configured to insert and protect the electromagnetically-shielded wiring harness 23 as a whole, as described previously. Accordingly, in the embodiment, the electrical wire-protecting member 24 can be intended to protect a relatively long range of the electromagnetically-shielded wiring harness 23, as shown in FIG. 1. Otherwise, the electrical wire-protecting member 24 may be intended to protect only short range of the electromagnetically-shielded wiring harness 23.

The electrical wire-protecting member 42 can include a cylindrical pipe 42, two corrugated tubes 43, and two protectors 44. The cylindrical pipe 42 and the corrugated tubes 43 are connected to each other via the protector 44 so as to form the electrical wire-protecting member 24. The tubular pipe 42 can be arranged along the lower portion 10 of the vehicle body frame 8. The corrugated tube 43 can be arranged at the front side 6 and back side 7 in the interior of the vehicle body. The protector 44 may be a coupling member, and be used as a fixing member with respect to the vehicle body.

Because the electromagnetically-shielded wiring harness 23 has electromagnetic shielding properties, the electrical wire-protecting member 24 may or may not have electromagnetic shielding properties. In this case, the electrical wire-protecting member 24 needs not have electromagnetic shielding properties.

The cylindrical pipe 42 and the corrugated tube 43 may be formed of either of metallic material or synthetic material. In the embodiment, the cylindrical pipe 42 is formed of metallic material, and the corrugated tube 43 is formed of synthetic resin. In the embodiment, the cylindrical pipe 42 employs a known pipe. The corrugated tube 43 also employs a known corrugated tube.

The electrical wire-protecting member 24 may be formed otherwise. For example, the electrical wire-protecting member 24 is provided with either of the cylindrical pipe 42 or the corrugated tube 43. Otherwise, if the electrical wire-protecting member 24 can be fixed to the vehicle body, the protector 44 may be substituted with metallic bracket or clamp, or resin band or clip.

The embodiment in which the electrical wire-protecting member 24 (or the cylindrical pipe 42) is formed of metallic material will be hereinafter described in detail. In a case where the electrical wire-protecting member 24 is formed of metallic material, the protecting properties may be enhanced in comparison with an electrical wire-protecting member formed of resin. In one embodiment, aluminum may be employed in light of protecting properties and weight-saving. Furthermore, in other embodiment, stainless steel may be employed in light of protecting properties and weather resistance. However, other metallic material can be suitably used for the electrical wire-protecting member 24. In this embodiment, aluminum is employed.

A process for manufacture of the same structure and the following routing or arrangement will be hereinafter described. In accordance with one embodiment, the high-voltage electrical wire 22 and the low-voltage electrical wires 25 are inserted into and led from the predetermined tubular shielding member 26, then the electrical wire-protecting member 24 is attached or coupled to the tubular shielding member 26, and then terminal connection is carried out while the shielding terminal portion 27 being tucked. As such, the process for manufacture of the wiring harness in accordance with the invention is completed. After the above process, the wiring harness 21 can be mounted to the desired location of the vehicle body in a factory. As such, wire routing is completed.

In accordance with the above embodiment, the high-voltage electrical wire 22 and the low-voltage electrical wire 25 are inserted to and led from the tubular shielding member 26. However, the tubular shielding member 26 may be wound around the high-voltage electrical wire 22 and the low-voltage electrical wire 25. For example, the tubular shielding member 26 in a shape of sheet may be wound around the high-voltage electrical wire 22 and the low-electrical wire 25, and it may be then fixed to the high-voltage electrical wire 22 and the low-electrical wire 25 by means of, an adhesive, a bundling member, a tape or the like. This method (i.e., the above winding method) will work when the electrical wire is inserted to and led from the tubular shielding member 26 with difficulty. Moreover, it can be said that the above winding method can be securely performed in a case where the tubular shielding member 26 has the metallic film 36 and the braid 33.

As described previously with reference to FIGS. 1 and 2, the embodiment of the electromagnetically-shielded wiring harness 23 includes the plurality of high-voltage electrical wires 22, and the tubular shielding member 26 having the shielding terminal portions 27, which is formed of the braid 33, at its both ends, and the shielding body portion 28, which accounts for the majority of the remaining portions and is formed of the metallic film 36. Moreover, the plurality of high-voltage electrical wire 22 includes the bundled portion 31 and the enlarged or extended portions 30 continuous with both ends of the bundled portion 31. The bundled portion 31 accounts for the majority of the high-voltage electrical wire 22. As a result, the plurality of high-voltage electrical wires 22 can be arranged such that its width is minimized Accordingly, the resultant wiring harness can be downsized, and be weight-saved while maintaining enough connection reliability (i.e., contact reliability).

In accordance with the invention, the shielding terminal portion 27 is formed of braid 33, thereby allowing for enhanced workability in terminal connection. Moreover, the metallic film 36 accounts for the majority of the tubular shielding member 26, thereby allowing for remarkable electromagnetic shielding effect due to the metallic film 36.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

In the above description, the shielding terminal portion 27 (i.e., tubular braided member) can be considered as a drain wire of the shielding body portion 28 (i.e., tubular metallic film member). In such case, the invention can be characterized by the following points 1-8.

Point 1
A wiring harness, comprising:
a plurality of electrical wires; and
a tubular, shielding metallic film member formed of electrically-conductive metallic film and configured to receive the plurality of electrical wires as a whole therein, wherein the tubular metallic film member has at least one end which is coupled or connected to a tubular braided member as a drain wire which is connected to a shield part of a device side.

Point 2
The wiring harness according to Point 1, wherein the tubular braided member is made broader or wider than the tubular metallic film member such that it corresponds to an enlarged portion of the plurality of electrical wires which is enlarged in conformity with an terminal arrangement of the plurality of electrical wires or a shape of the shield part of the device side.

Point 3
The wiring harness according to Point 1 or 2, further including a overlapped section in which the tubular braided member and the tubular metallic film member are overlapped at their ends, wherein the tubular braided member and the tubular metallic film member are coupled or connected to each other in the overlapped section.

Point 4
The wiring harness according to Point 3, wherein the tubular braided member and the tubular metallic film member are coupled to each other in the overlapped section in accordance with clamping or clipping process by using at least two ring members, and wherein one ring member of the at least two ring members is disposed on a tubular inner side (i.e., the inner side of the overlapped section), and an another ring member of the at least two ring members is disposed on a tubular outer side (i.e., the outer side of the overlapped section).

Point 5
The wiring harness according to Point 3, wherein the tubular braided member and the tubular metallic film member are coupled or connected to each other in the overlapped section by winding a bundling member around the overlapped section, or by taping.

Point 6
The wiring harness according to any of Points 1-5, wherein the tubular metallic film member is solely formed of the metallic film, or is formed of multiple layers, of which one is the metallic film.

Point 7
The wiring harness according to any of Points 1-6, further including a shield shell which is integrally formed with the shielding terminal portion in which the tubular terminal portion is disposed.

Point 8
The wiring harness according to any of Points 1-7, further including an electrical wire-protecting member configured to cover a portion sought for protection of the plurality of electrical wire over which the tubular metallic film member is disposed.

REFERENCE SIGNS LIST

1: hybrid vehicle
2: engine
3: motor
4: inverter (i.e., first device)
5: battery (i.e., second device)
6: front side of vehicle body (interior)
7: back side of vehicle body (interior)
8: vehicle body frame
9: upper portion of vehicle body frame
10: lower portion of vehicle body frame
11: reinforcement
12: electric junction box
13: low-voltage battery
21: wiring harness
22: high-voltage electrical wire (i.e., electrical wire)
23: electromagnetically-shielded wiring harness
24: electrical wire-protecting member
25: low-voltage electrical wire
26: tubular shielding member
27: shielding terminal portion
28: shielding body portion
29: covering portion
30: electrical wire enlarged or extended portion
31: bundled electrical wires
32: overlapped section
33: braid
34: shield shell
35: caulking ring
36: metallic film
37: adhesive layer
38: resin sheet 39: tin-plated layer
40: tang (i.e., ring member)
41: caulking ring (i.e., ring member)
42: cylindrical pipe
43: corrugated tube
44: protector

The invention claimed is:

1. A wiring harness, comprising:
   a plurality of electrical wires; and
   a tubular shielding member configured to receive the plurality of electrical wires as a whole therein, and coupled to a shield part of a device side via a tubular terminal portion, and comprising:
   a shielding body portion disposed over a bundled portion in which the plurality of electrical wires is bundled as a whole, and
   a shielding terminal portion disposed over an enlarged portion of the plurality of electrical wires thereby corresponding to the enlarged portion, wherein the enlarged portion is wider than the bundled portion in conformity with an terminal arrangement of the plurality of electrical wires or a shape of the shield part of the device side;
   wherein the shielding terminal portion is continuous with at least one end of the shielding body portion; and
   wherein the shielding terminal portion is formed of braid,
   wherein the shielding body portion is formed of multiple layers, of which one is a metallic film,
   wherein the shielding body portion is formed such that a diameter of the shielding body portion is made constant,
   wherein the tubular shielding member has an overlapped section in which the braid overlaps with the metallic film, and
   wherein the braid and the metallic film are coupled or connected to each other in the overlapped section in accordance with clamping or clipping process by using at least two ring members, and wherein one of the at least two ring members is disposed on an inner surface of the shielding terminal portion at the overlapped section, and the other ring member is disposed on an outer surface of the tubular shielding member.

2. The wiring harness according to claim 1, wherein the braid and the metallic film are coupled or connected to each other in the overlapped section.

3. The wiring harness according to claim 2, wherein the braid and the metallic film are coupled or connected to each other in the overlapped section by winding a bundling member around the tubular shielding member, or by taping.

4. The wiring harness according to claim 3, wherein the shielding body portion is solely formed of the metallic film, or is formed of multiple layers, of which one is the metallic film.

5. The wiring harness according to claim 4, further including a shield shell which is integrally formed with the shielding terminal portion in which the tubular terminal portion is disposed.

6. The wiring harness according to claim 3, further including a shield shell which is integrally formed with the shielding terminal portion in which the tubular terminal portion is disposed.

7. The wiring harness according to claim 1, further including a shield shell which is integrally formed with the shielding terminal portion in which the tubular terminal portion is disposed.

8. The wiring harness according to claim 2, wherein the shielding body portion is solely formed of the metallic film, or is formed of multiple layers, of which one is the metallic film.

9. The wiring harness according to claim 8, further including a shield shell which is integrally formed with the shielding terminal portion in which the tubular terminal portion is disposed.

10. The wiring harness according to claim 2, further including a shield shell which is integrally formed with the shielding terminal portion in which the tubular terminal portion is disposed.

11. The wiring harness according to claim 1, wherein the plurality of electrical wires comprises: a plurality of large high-voltage electrical wires; and a plurality of low-voltage electrical wires, each of the plurality of large high-voltage electrical wires is adjacent to the plurality of large low-voltage electrical wires in the bundled portion.

* * * * *